United States Patent
Ogimoto et al.

(10) Patent No.: US 6,469,292 B1
(45) Date of Patent: Oct. 22, 2002

(54) PHOTODETECTOR AND METHOD OF DRIVING THE SAME

(75) Inventors: Yasushi Ogimoto, Noda (JP); Kenji Nakanishi, Chiba (JP); Kunio Kojima, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/558,125

(22) Filed: Apr. 25, 2000

(30) Foreign Application Priority Data

Apr. 27, 1999 (JP) .............................. 11-118973

(51) Int. Cl.⁷ .............................................. H01L 31/04
(52) U.S. Cl. ............................... 250/214.1; 250/214 R; 257/431
(58) Field of Search .......................... 250/214.1, 214 R; 330/308, 86; 257/431, 444, 448, 449

(56) References Cited

U.S. PATENT DOCUMENTS 5,030,831 A * 7/1991 Coon et al. ............... 250/338.4
5,643,369 A * 7/1997 Tanaka et al. .............. 136/256

FOREIGN PATENT DOCUMENTS

| JP | 9-265652 | 10/1997 |
| JP | 10-261291 | 9/1998 |

OTHER PUBLICATIONS

Miyano et al., "Photoindued Insulator to Metal transition in a Perovskite Maganite", Jun. 2, 1997, Physical review letters, volumn 78, No. 22. The American Physical Society, pp.4257–4260.*

Nikkei Electronics, No. 708 (Jan. 26, 1998), pp. 127–135.

"Photoinduced Insulator–to–Metal Transition in a Perovskite Manganite," K. Miyano, et al. Physical Review Letters, vol. 78, No. 22. The American Physical Society, Jun. 2, 1997, pp. 4257–4260.

"Spatial Properties of the Photoinduced Transition in $Pr_{0.7}Ca_{0.3}MnO_3$", T. Mori, et al. Journal of the Physical Society of Japan, vol. 66, No. 11, Nov. 11, 1997, pp. 3570–3576.

* cited by examiner

Primary Examiner—Robert H. Kim
Assistant Examiner—Hoon K. Song
(74) Attorney, Agent, or Firm—Dike, Bronstein, Roberts & Cushman IP Group Edwards & Angell, LLP; David G. Conlin; David A. Tucker

(57) ABSTRACT

A photodetector includes a photoelectric conversion layer for performing an insulator-metal transition by receiving light, and a pair of electrodes provided opposite to each other in contact with the photoelectric conversion layer, between which a voltage is applied. In the photodetector, the pair of electrodes are arranged on the photoelectric conversion layer such that a region of the photoelectric conversion layer which performs the insulator-metal transition and a region to which the voltage is applied through the pair of electrodes are substantially coincident with each other.

10 Claims, 15 Drawing Sheets

PHOTODETECTOR AND METHOD OF DRIVING THE SAME

CROSS-REFERENCE TO RELATED APPLICATION

This application is related to Japanese patent application No. HEI 11(1999)-118973 filed on Apr. 27, 1999 whose priority is claimed under 35 USC §119, the disclosure of which is incorporated herein by reference in its entirety.

BACKGROUND OF THE INVENTION

1. Field of the Invention

The present invention relates to a photodetector and a method of driving the photodetector, and more particularly to a photodetector for a short wavelength (violet color) suitable used for an optical pickup and a method of driving the photodetector.

2. Description of the Related Art

In recent years, there has been a prospect that a violet semiconductor laser (wavelength λ=approximately 400 nm) using a GaN based material or a violet laser using a SHG (secondary harmonic generation) element can practically be developed, and it has been expected that an optical memory can have a density increased by a reduction in a wavelength of a light source.

However, Nikkei Electronics 1998. 1.26 (No. 708) pp. 127–129 has described that the following problem arises in that a signal is reproduced from a recording mark which is made minute with a reduction in a wavelength of a light source, for example.

Referring to the description, it is hard to reproduce a signal because the sensitivity of a pin photodiode of Si which is a photodetector used in an optical pickup for an optical memory in addition to a decrease in a signal amount (caused by a reduction in a size of the recording mark). The cause includes (1) a decrease in the number of photons caused by a reduction in the wavelength of the light source, (2) a reduction in a quantum efficiency (Although a light absorption coefficient of Si to be the material of the photodetector is increased with a reduction in the wavelength so that a probability of absorption near a surface is increased, a generated carrier is recombined and easily dissipated because there are a large number of surface states near the surface), and the like.

As measures to improve a sensitivity with the short wavelength of the photodetector, an antireflection film is improved corresponding to a wavelength of a violet color or a thickness of an i layer having a pin type structure is regulated. In the pin photodiode having no amplifying function, however, a light receiving sensitivity has limitations as a matter of course. Under such a background, an increase in a density of an optical memory has needed a photodetector and an optical pickup which have an amplifying function that is capable of ensuring a light receiving sensitivity corresponding to a decrease in a signal amount and a reduction in the wavelength of the light source (violet color: wavelength λ=approximately 400 nm) in addition to the conditions (1) a high speed operation (<10 nsec) and (2) a low operating voltage (<5 V) which are required in respect of a recording and reproducing speed and consumed power.

As the photodetector having the amplifying function, an avalanche photodiode has been well known. For example, Japanese Laid-Open Patent Publication No. Hei 9(1997)-265652 has described an optical pickup using the avalanche photodiode having the amplifying function which serves to cope with a reduction in a sensitivity of a photodetector for a short-wavelength light source having a violet color. However, the avalanche photodiode usually requires an operating voltage of 100 V or more,. Therefore, it is hard to use the avalanche diode as a photodetector for an optical memory.

On the other hand, Japanese Laid-Open Patent Publication No. Hei 10(1998)-261291 has described "an optical switching element using an insulator-metal transition generated by irradiating light on a manganese oxide", which is not the photodetector such as the pin photodiode or the avalanche diode. According to this publication, a gold electrode is formed at an interval of 50 μm on a single crystal $Pr_{0.7}Ca_{0.3}MnO_3$, and an insulator-metal transition is caused to greatly change an electric resistance when a YAG (yttrium-aluminum-garnet) laser beam is irradiated while applying a DC bias voltage of several V to the gold electrode. The insulator-metal transition caused by the light irradiation on the $Pr_{0.7}Ca_{0.3}MnO_3$ has also been described in detail n the document "Physical Review Letters Vol. 78, No. 22, (1997), pp. 4257–4260" and "Journal of the Physical Society of Japan Vol. 66, No. 11 (1997), pp. 3570 to 3576).

However, the use of the optical switching element as described above as a photodetector for an optical memory has a problem in respect of a response speed because (1) a relaxation time (a time required for an insulator-metal transition) is long, for example, several hundreds nsec to several μsec for the generation of the insulator-metal transition. Moreover, (2) since a bias voltage of at least several tens V or more is required for causing the insulator-metal transition by feeble reflected light (several μW) transmitted from a recording bit, there is a problem in respect of an operating voltage. Furthermore, since (3) a metal state is held even if the light irradiation is stopped after the complete transition to the metal state is carried out, it is hard to detect the presence of the recording bit.

SUMMARY OF THE INVENTION

In order to solve the above-mentioned problems, it is an object of the present invention to provide a photodetector having a light receiving sensitivity corresponding to a decrease in a signal amount with an increase in a density of an optical memory and a reduction in a wavelength of a light source (violet color: wavelength λ=approximately 400 nm) by utilizing, as an amplifying function, an insulator-metal transition by light irradiation and capable of carrying out a high-speed and low-voltage operation suitable for a photodetector for the optical memory, a method of driving the photodetector and an optical pickup using the photodetector and the driving method thereof.

The present inventors have paid attention to the relationship of an arrangement between an electrode and a region (referred to as a complex excitation region) in a photoelectric conversion layer where a light irradiation region and a voltage application region are overlapped because of the generation of an insulator-metal transition in the complex excitation region and have found that the insulator-metal transition can be implemented at a high speed and a low voltage by properly setting the relationship of the arrangement.

The present invention provides a photodetector comprising: a photoelectric conversion layer for performing an insulator-metal transition by receiving light; and a pair of electrodes provided opposite to each other in contact with the photoelectric conversion layer, between which a voltage is applied, wherein the pair of electrodes are arranged on the photoelectric conversion layer such that a region of the photoelectric conversion layer which performs the insulator-metal transition and a region to which the voltage is applied through the pair of electrodes are substantially coincident with each other (overlapped almost wholly).

This object as well as other objects, features and advantages of the invention will become more apparent to those skilled in the art from the following description with reference to the accompanying drawings.

DETAILED DESCRIPTION OF THE PREFERRED EMBODIMENTS

Figure 1A:
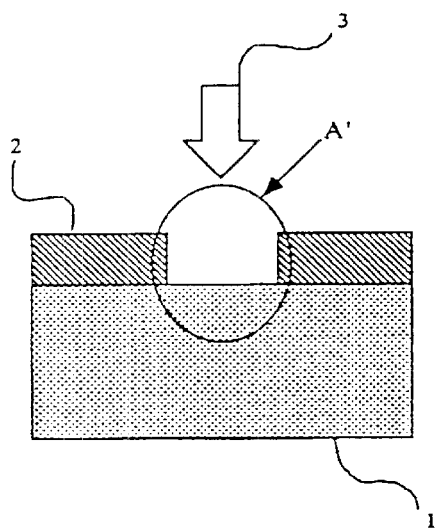
FIG. 1(a) is a schematic sectional view showing a conventional element structure.

In the photodetector according to the present invention, preferably, the electrodes are arranged in a pair of concave portions provided on the photoelectric conversion layer. Moreover, it is preferable that the electrodes should have transparency. It is more preferable that the photoelectric conversion layer should be interposed between the electrodes and one of the electrodes should have transparency.

In the context of the invention the terms "transpatent" and "transparency" also mean "translucent" and "translucency".

In a method of driving a photodetector, a constant DC voltage is applied between a pair of electrodes, thereby causing the photodetector to be operated in such a state that a photoelectric conversion layer performs a transition from an insulator to a metal in analog depending on an amount of received light.

In the method of driving a photodetector, preferably, a threshold of a minimum amount of light which can be detected is controlled by a value of the constant DC voltage to be applied between the electrodes.

In the method of driving a photodetector, moreover, a DC pulse voltage is applied between a pair of electrodes, thereby causing the photodetector to be operated in such a state that a photoelectric conversion layer performs a transition from an insulator to a metal in digital depending on an amount of received light.

In the method of driving a photodetector, preferably, a pulse width of the DC pulse voltage to be applied between the electrodes is 1/10 or less of a minimum pulse width of the received light. More preferably, a minimum value of the DC pulse voltage to be applied between the electrodes is set greater than a voltage value with which the photoelectric conversion layer starts the insulator-metal transition and is set smaller than a minimum voltage value capable of maintaining a resistance value obtained when the photoelectric conversion layer completes the insulator-metal transition.

The photodetector can be incorporated to be driven by the driving method, thereby reading a light signal from an optical memory.

More specifically, the photodetector and the driving means are combined, and furthermore, a light source and a converging optical system are provided. Consequently, an optical pickup capable of carrying out a high-speed and low voltage operation can be obtained.

Preferred embodiments of a photodetector, a driving method thereof and an optical pickup constituted by them according to the present invention will be described below in the following order.
(a) Principle and Structure (Arrangement of Photoelectric Conversion layer and Electrode)
① Structure of Element described in Japanese Laid-Open Patent Publication No. Hei 10-261291 (which will be hereinafter referred to as a "conventional element") (Comparative Example)
② First Embodiment (Side Electrode)
③ Second Embodiment (Transparent Electrode)
④ Third Embodiment (Thin Film Structure)
(b) Driving Method
① Utilization of incomplete insulator-metal transition
② Utilization of complete insulator-metal transition— driving for selecting one voltage pulse width
③ Utilization of complete insulator-metal transition— driving for selecting two voltage pulse values
(c) Detection of Signal from Optical Disk by Optical Pickup
The details are as follows.
(a) Principle and Structure (Arrangement of Photoelectric Conversion layer and Electrode)

Comparative Example

Structure of Conventional Element

First of all, the structure of a conventional element will be described.

FIG. 1(a) is a schematic sectional view showing the structure of the conventional element. As shown, an electrode 2 is formed at an interval of L' on a photoelectric conversion layer (a layer of an element for causing an insulator-metal transition) 1. The electrode 2 is an opaque electrode for reflecting or absorbing incident light 3.

Figure 1B:
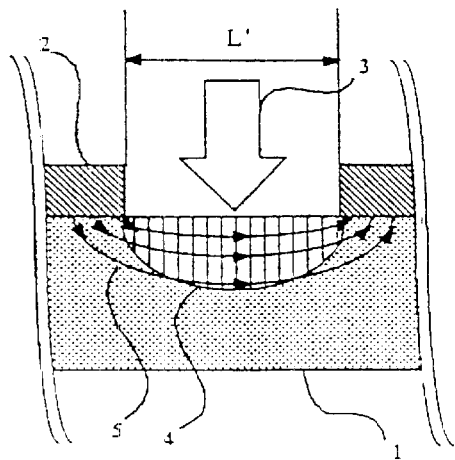
FIG. 1(b) is an enlarged sectional view showing an A' portion of the conventional element structure.

With reference to FIG. 1(b), description will be given to the state in which the photoelectric conversion layer 1 causes an insulator-metal transition when the incident light 3 is irradiated with application of a voltage between the electrodes of the conventional element, resulting in a change in a resistance value between the electrodes (a decrease in the resistance value). FIG. 1(b) is a view showing, in detail, an enlarged A' portion specified by an ellipse in FIG. 1(a) in order to illustrate the principle of an operation in the structure of the conventional element. The incident light 3 cannot be transmitted through the electrode 2. Therefore, the photoelectric conversion layer 1 formed under the electrode 2 is not provided with a light irradiation region 4. The light irradiation region 4 in the photoelectric conversion layer 1 is limited to the inside of a portion L' between the electrodes in the direction of the electrodes.

The state in which a voltage is applied to the photoelectric conversion layer 1 through the electrode 2 is illustrated by an electric line of force 5. By paying attention to the principle of the operation in which an insulator-metal transition is generated in a region (complex excitation region) where the light irradiation region 4 of the photoelectric conversion layer 1 and a voltage application region shown by the electric line of force 5 are overlapped, the complex excitation region for causing the transition between the electrodes and the electrode 2 are slightly overlapped on electrode ends and, preferably, the photoelectric conversion layer 1 region provided under the electrode 2 in which the transition is not caused is greatly interposed between the electrodes 2.

As described above, the structure of the conventional element includes the region where the light irradiation region 4 and the voltage application region shown by the electric line of force 5 are not overlapped in the direction of the electrodes. Therefore, an efficiency at which a carrier (not shown) generated in the complex excitation region by the transition reaches the electrode 2 is remarkably reduced. As a result, a relaxation time is prolonged. This is a substantial problem caused by the principle of the operation of the insulator-metal transition and the structure of the element irrespective of the distance L' between the electrodes. Furthermore, since the applied voltage is not utilized effectively, an applied voltage required for causing the transition should be raised.

First Embodiment

Figure 2A:
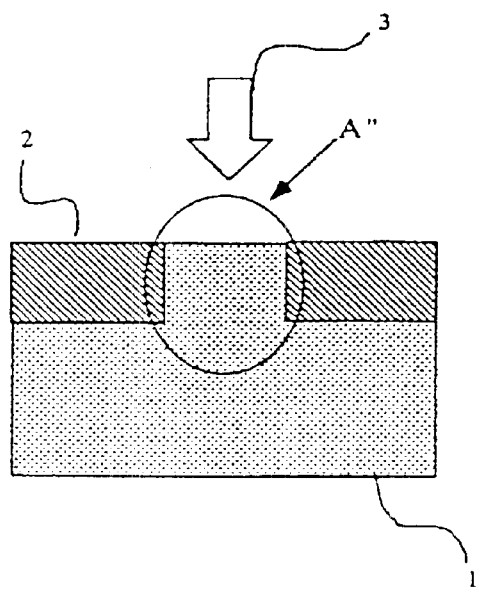
FIG. 2(a) is a schematic sectional view according to a first embodiment of the present invention.

Next, description will be given to a first photodetector according to a first embodiment of the present invention. FIG. 2(a) is a schematic sectional view showing the first embodiment. An electrode 2 on a photoelectric conversion layer 1 is arranged such that the photoelectric conversion layer 1 and a face of the electrode 2 are almost even with each other for incident light 3 and the photoelectric conversion layer 1 is interposed between side faces of the electrode 2 as shown in FIG. 2(a). Such a structure is fabricated by processing both sides of a region of the photoelectric conversion layer 1 which is specified by a width L" to have such a depth as to be almost equal to the thickness of the electrode 2 and forming the electrode 2 in the processed portion. The electrode 2 is opaque with respect to the incident light 3. More specifically, light is not irradiated on the photoelectric conversion layer 1 having the electrode 2 formed thereunder.

Figure 2B:
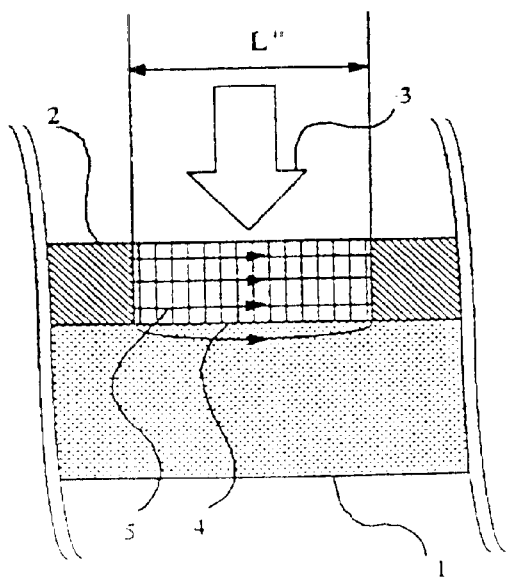
FIG. 2(b) is an enlarged sectional view showing an A" portion according to the first embodiment of the present invention.

With reference to FIG. 2(b), description will be given to a state in which when the incident light 3 is irradiated while applying a voltage between the electrodes 2, the photoelectric conversion layer 1 causes an insulator-metal transition, resulting in a change in a resistance value between the electrodes 2 in the first embodiment FIG. 2(b) is a view showing, in detail, an enlarged A" portion specified by an ellipse in FIG. 2(a). The incident light 3 cannot be transmitted through the electrode 2. Therefore, a light irradiation region 4 is not formed on the photoelectric conversion layer 1 provided under the electrode 2. The light irradiation region 4 in the photoelectric conversion layer 1 is restricted to the inside between the electrodes L" in the direction of the electrodes.

A state in which a voltage is applied to the photoelectric conversion layer 1 through the electrode 2 is shown by an electric line of force 5. In the first embodiment, the light irradiation region 4 of the photoelectric conversion layer 1 and a voltage application region shown by the electric line of force 5 are overlapped (are coincident with each other) almost wholly in the direction of the electrodes. Taking note of the operation principle in which the insulator-metal transition is generated in a complex excitation region, the complex excitation region causing the transition is formed almost uniformly between the electrodes.

In the first embodiment, the photoelectric conversion layer 1 region which does not cause the transition between the electrodes is not included. Therefore, carriers (not shown) generated in the complex excitation region by the transition efficiently reach the electrode 2. As a result, a relaxation time which is a problem in the conventional element structure can be remarkably reduced down to 1 nsec or less by properly selecting a distance between the electrodes.

Since the influence of the electric line of force going around the electrodes can be reduced almost negligibly by setting the processing depth of the photoelectric conversion layer 1 such that the light cannot reach the photoelectric conversion layer 1, it is not important. Furthermore, the applied voltage can be utilized effectively. Therefore, it is also possible to reduce the applied voltage required for causing the transition to 5 V or less.

Second Embodiment

Figure 3A:
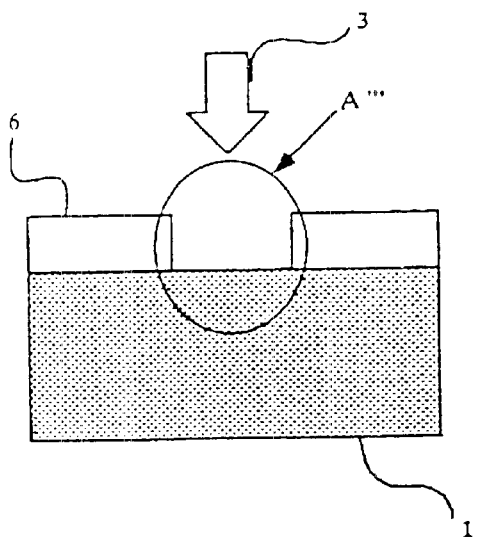
FIG. 3(a) is a schematic sectional view according to a second embodiment of the present invention.

Description will be given to a photodetector according to a second embodiment of the present invention. FIG. 3(a) is a schematic sectional view showing the second embodiment. As shown, a transparent electrode 6 is formed on a photoelectric conversion layer 1 at an interval L'''. Since incident light 3 is transmitted through the transparent electrode 6, it is also irradiated on the photoelectric conversion layer 1 provided under the transparent electrode 6.

Figure 3B:
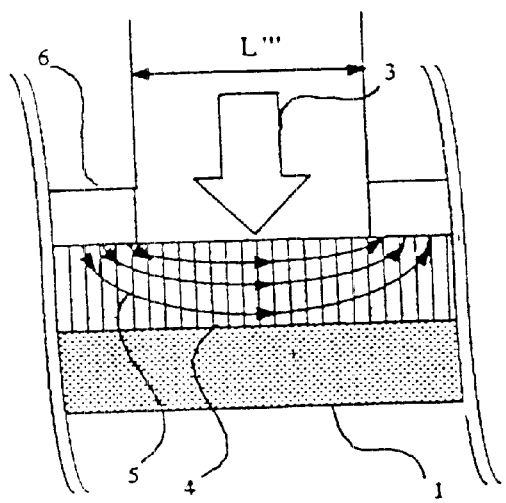
FIG. 3(b) is an enlarged sectional view showing an A'" portion according to the second embodiment of the present invention.

With reference to FIG. 3(b), description will be given to a state in which when the incident light 3 is irradiated while applying a voltage between the electrodes 2, the photoelectric conversion layer 1 causes an insulator-metal transition, resulting in a change in a resistance value between the electrodes 2 in the second embodiment. FIG. 3(b) is a view showing, in detail, an enlarged A''' portion specified by an ellipse in FIG. 3(a). The incident light 3 is transmitted through the transparent electrode 6. Therefore, a light irradiation region 4 in the photoelectric conversion layer 1 is not restricted by an interval L''' between the electrodes in the direction of the electrodes.

A state in which a voltage is applied to the photoelectric conversion layer 1 through the transparent electrode 6 is shown by an electric line of force 5. In the second embodiment, the light irradiation region 4 is also formed under the electrode. Therefore, the light irradiation region 4 of the photoelectric conversion layer 1 and a voltage application region shown by the electric line of force 5 can be overlapped almost completely in the direction of the electrodes. More specifically, a complex excitation region for causing a transition is formed almost uniformly between the electrodes.

In the second embodiment, it is easier to obtain, without processing the photoelectric conversion layer 1, an element structure in which the light irradiation region 4 of the photoelectric conversion layer 1 and the voltage application region shown by the electric line of force 5 are overlapped almost completely in the direction of the electrodes. In the same manner as in the first embodiment, consequently, a relaxation time can be remarkably shortened (approximately 1 nsec or less) by properly selecting a distance between the electrodes. Moreover, the applied voltage can be utilized effectively. Therefore, it is also possible to reduce the applied voltage required for causing the transition to 5V or less.

Third Embodiment

Figure 4A:
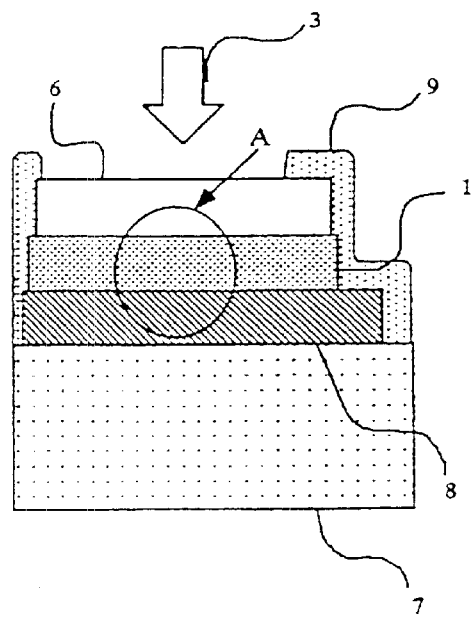
FIG. 4(a) is a schematic sectional view according to a third embodiment of the present invention.

Next, description will be given to a photodetector according to a third embodiment of the present invention. FIG. 4(a) is a schematic sectional view showing the third embodiment. As shown, a lower electrode 8, a photoelectric conversion layer 1 and a transparent electrode 6 are sequentially formed on a substrate 7.

Preferably, the thickness of the photoelectric conversion layer 1 is selected such that incident light 3 is transmitted through the transparent electrode 6 and is fully irradiated on the photoelectric conversion layer 1 provided under the transparent electrode 6. It is preferable that the photoelectric conversion layer 1 should be a thin film.

Figure 4B:
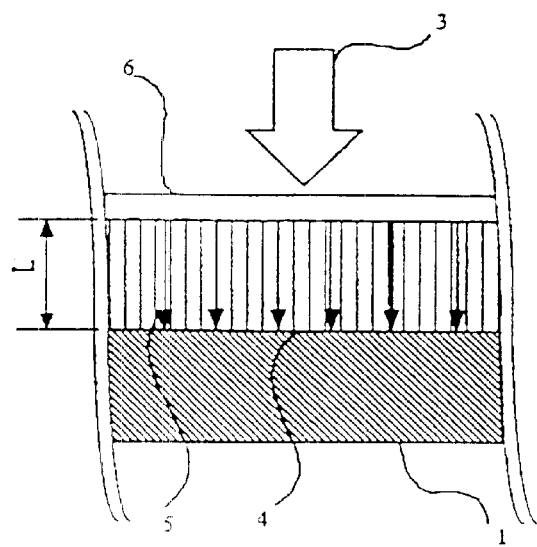
FIG. 4(b) is an enlarged sectional view showing an A portion according to the third embodiment of the present invention.

With reference to FIG. 4(b), description will be given to a state in which when the incident light 3 is irradiated while applying a voltage between the electrodes 2, the photoelectric conversion layer 1 causes an insulator-metal transition, resulting in a change in a resistance value between the electrodes 2 in the third embodiment. FIG. 4(b) is a view showing, in detail, an enlarged A portion specified by an ellipse in FIG. 4(a). The incident light 3 is transmitted through the transparent electrode 6. Therefore, it is supposed that a light irradiation region 4 in the photoelectric conversion layer 1 is provided uniformly in the direction of the electrodes particularly if the photoelectric conversion layer 1 is a thin film.

A state in which a voltage is applied to the photoelectric conversion layer 1 through the lower electrode 8 and the transparent electrode 6 is shown by an electric line of force 5. In the third embodiment, the light irradiation region 4 is also formed under the electrode. Therefore, the light irradiation region 4 of the photoelectric conversion layer 1 and a voltage application region shown by the electric line of force 5 can be overlapped almost completely in the direction of the electrodes. More specifically, a complex excitation region for causing a transition is formed almost uniformly between the electrodes.

In the third embodiment, the photoelectric conversion layer 1 is not processed and a distance L between the electrodes is determined by the thickness of the photoelectric conversion layer 1. Since the thickness can easily be controlled, fabrication can be carried out more simply, and furthermore, a light receiving area and the distance L between the electrodes can be designed independently. In the same manner as in the first and second embodiments, a relaxation time which is a problem in the conventional element structure can be remarkably shortened to 1 nsec or less by properly selecting the distance between the electrodes. Moreover, the applied voltage can be utilized effectively. Therefore, it is also possible to reduce the applied voltage required for causing the transition to 5 V or less.

(b) Driving Method

Subsequently, a method of driving the photodetector according to the present invention will be described.

Fourth Embodiment

Figure 5:
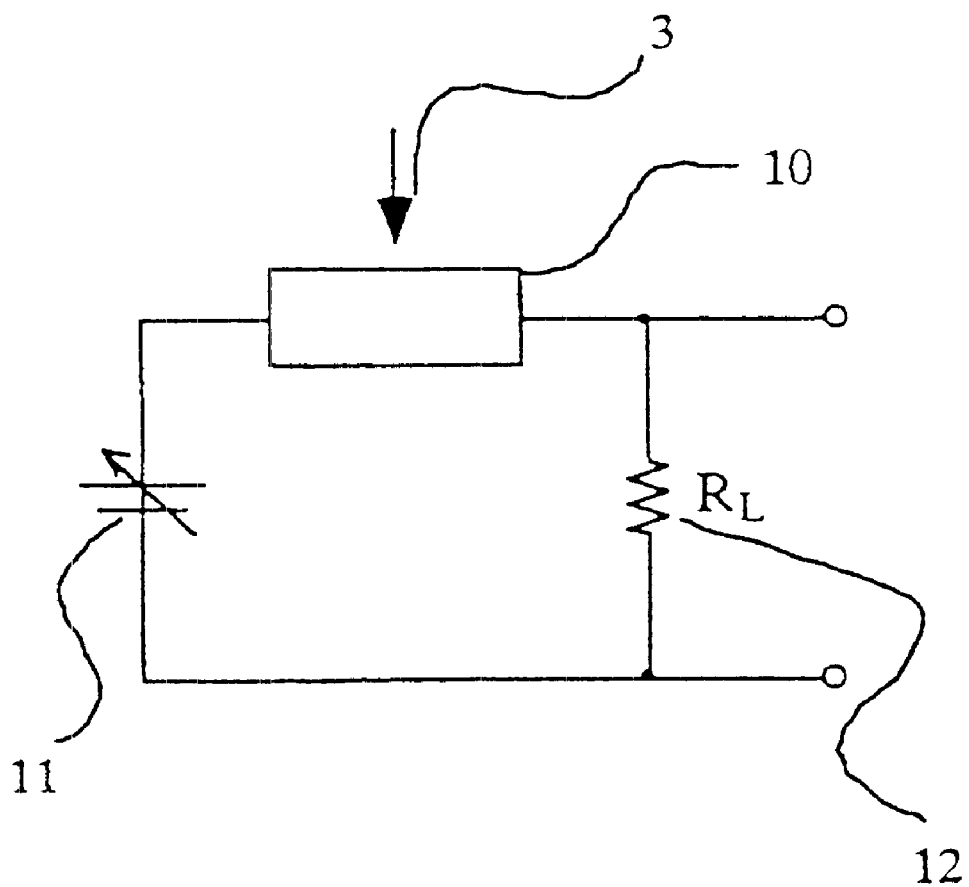
FIG. 5 is a diagram showing the schematic structure of a circuit for driving a photodetector at a constant voltage according to the present invention.

Description will be given to a method of utilizing an incomplete insulator-metal transition according to a fourth embodiment. FIG. 5 schematically shows the structure of a circuit for driving a photodetector according to the fourth embodiment. A voltage is applied to a photodetector 10 by a DC constant voltage source 11, and an output is fetched through a load resistor $R_L$ 12.

Figure 6:
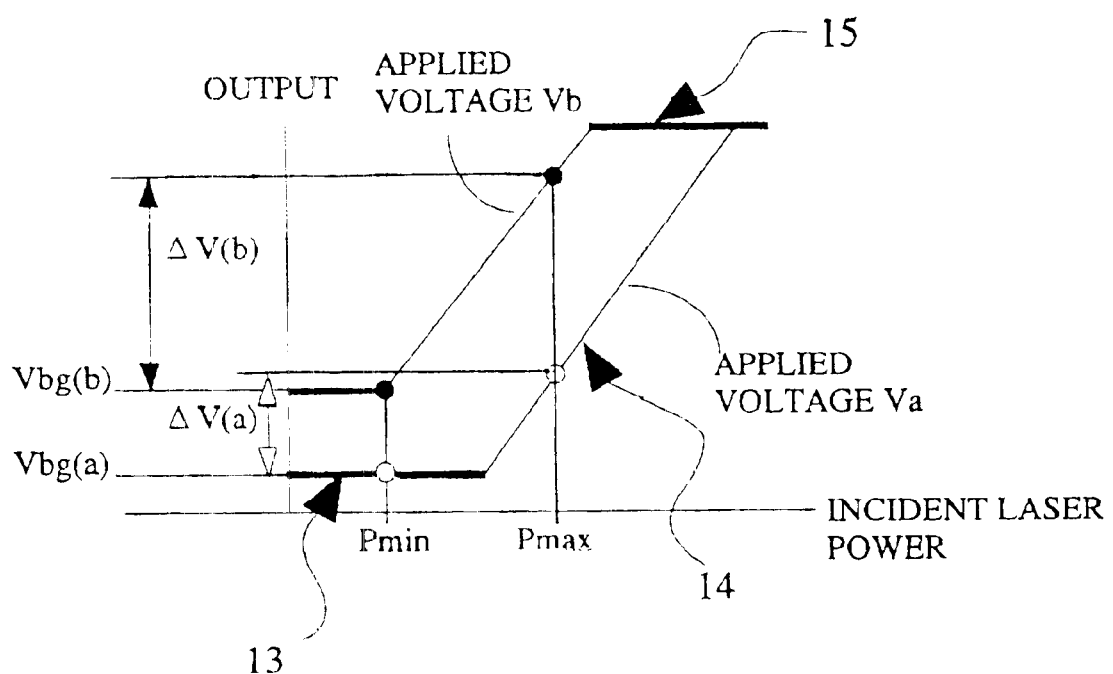
FIG. 6 is a chart showing the relationship between an amount of incident light and an output signal in the photodetector when voltages of Va and Vb are applied.

Next, the relationship between the amount of incident light and an output signal obtained through the load resistor $R_L$ 12 in the photodetector will be described with reference to FIG. 6. FIG. 6 is a graph obtained when each of voltage values Vb and Va (Vb>Va) is applied, wherein an axis of abscissa indicates the amount of incident light and an axis of ordinate indicates an output signal.

First of all, description will be given to a graph obtained when the voltage of Va is applied. In the graph, a medium thick line indicates a state in which a transition is not caused by light irradiation and a change in an output cannot be obtained (which will be referred to as a non-amplification region 13), that is, with the minimum amount of light or less which can be detected. When the amount of incident light is equal to or greater than a threshold with which the insulator-metal transition is started, a change in a resistance is caused corresponding to a variation in the amount of incident light. As a result, a change in an output value can be obtained (which will be referred to as an amplification region 14). This state is shown in a solid line. Furthermore, a thick line in the graph indicates a state in which an output value is saturated (which will be referred to as a saturation region 15) because the transition is completed with the amount of incident light increased to a certain value or more.

Next, description will be given to a change in the graph which is obtained by applying the voltage of Vb. The non-amplification region 13, the amplification region 14 and the saturation region 15 are obtained in the same manner as those obtained with the application of the voltage of Va. By a comparison between the graphs depending on the applied voltage, it is apparent that the threshold of the minimum amount of light which can be detected, and the maximum value of the amount of light for saturating the output are reduced and an output Vbg (which is equivalent to a dark current) obtained by the amount of light having the threshold or less is increased with an increase in the applied voltage value.

By taking, as an example, the case in which a variation in the amount of light to be a light receiving object (more specifically, a variation in the amount of light which is equivalent to a bit of "0" or "1" if the photodetector is used as an optical pickup of an optical memory) is defined as a minimum value Pmin and a maximum value Pmax, the influence of a difference in the applied voltages Vb and Va on the change in an output will be described below.

An output obtained by the amounts of light Pmin and Pmax with the applied voltage of Va is represented by a white circle and a change in the output obtained for a variation in the amount of light Pmax–Pmin is represented as ΔV(a). As shown in FIG. 6, since the amount of light Pmin is smaller than a threshold and a change in the output for a variation in the amount of light from Pmin to the threshold cannot be obtained. Consequently, the ΔV(a) is reduced.

On the other hand, an output obtained by the amounts of light Pmin and Pmax with the applied voltage of Vb is represented by a black circle and a change in the output obtained for a variation in the amount of light Pmax–Pmin is represented as ΔV(b). As shown in FIG. 6, it is apparent that ΔV(b) is greater than ΔV(a) because a change in the output is obtained for a variation (increase) in the amount of light of Pmin or more corresponding to the case in which the applied voltage is set such that the amount of light Pmin is almost equal to the threshold.

In the present embodiment, the applied voltage value is properly set corresponding to the variation in the amount of light to be received as shown by the applied voltage Vb, thereby controlling the threshold of the minimum amount of light which can be detected. Consequently, the photodetector is driven to obtain the optimum change in the output for the variation in the amount of light.

Next, description will be given to an output signal waveform obtained by receiving a continuous optical pulse.

Figure 7:
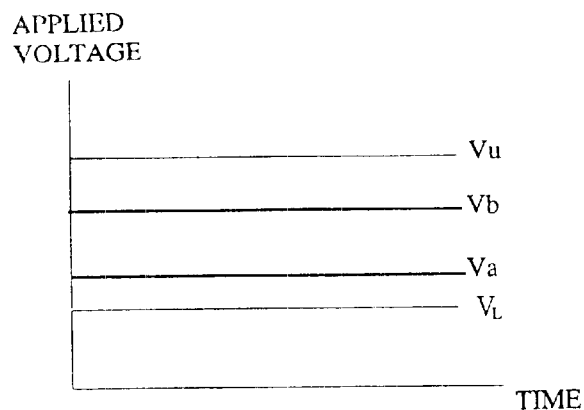
FIG. 7(a) is a chart showing the voltages Va and Vb to be applied to the photodetector according to the present invention.
FIG. 7(b) is a chart showing a time variation in an output signal for an incident light signal of the photodetector which is obtained when the voltages Va and Vb are applied according to the present invention.
Figure 7:
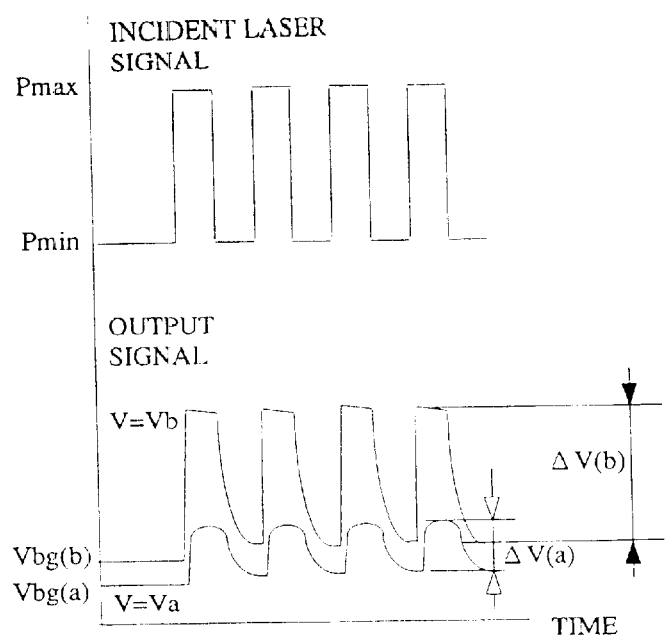

In FIG. 7(a), an axis of abscissa indicates a time required for voltage application and an axis of ordinate indicates a voltage value applied to the photodetector which shows an output characteristic for the amount of incident light. $V_L$ represents a voltage value with which a change in an output is not obtained by receiving the light having the amount Pmax and Vu represents a voltage value at which an output is saturated by receiving the light having the amount Pmax. Vb and Va are selected within this range.

FIG. 7(b) shows a change in an output which is obtained by receiving an optical pulse having a variation in the amount of light represented as Pmin to Pmax while applying DC constant voltages Vb and Va shown in FIG. 7(a) (the optical pulse is represented as a rectangular pulse in the drawing but is not restricted thereto). In FIG. 7(b), an axis of abscissa indicates a time and an axis of ordinate indicates a variation in the amount of incident light (a graph in an upper part) and an output signal (a graph in a lower part). From these graphs, it is apparent that the change in an output is amplified corresponding to the variation in the amount of light of the optical pulse. Moreover, it is apparent that the change in the output with the voltage Vb controlled to have a proper threshold is greater than the change in the output with the voltage Va as described above.

As described above, the driving method according to the present invention sets a DC applied voltage such that an optimum change in the output can be obtained corresponding to the variation in the amount of light. Consequently, it is possible to obtain a photodetector having an amplifying function and capable of carrying out a high-speed and low-voltage operation. Moreover, the output value amplified for the variation in the amount of light can be maximized by controlling a light amount detection threshold based on the applied DC voltage value.

Fifth Embodiment

Next, description will be given to a driving method for selecting a voltage pulse width which is a first method utilizing a complete insulator-metal transition according to a fifth embodiment.

Figure 8:
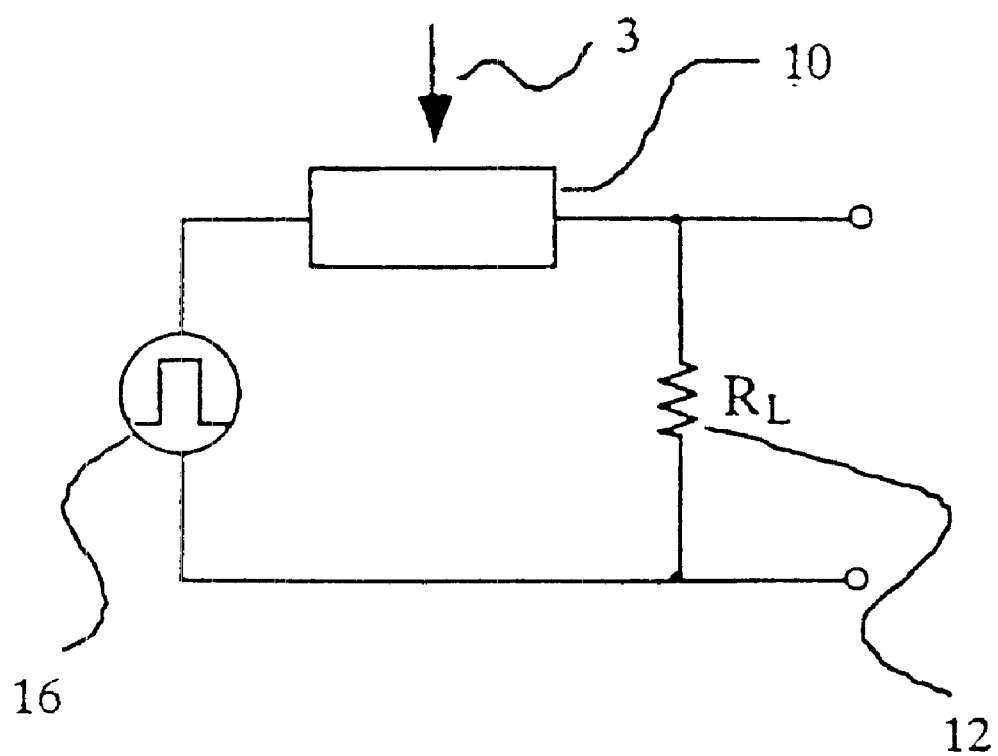
FIG. 8 is a diagram showing the schematic structure of a circuit for driving the photodetector according to the present invention.

FIG. 8 schematically shows the structure of a circuit for driving a photodetector. A DC pulse voltage is applied to a photodetector 10 by a DC pulse voltage source 16, and an output is fetched through a load resistor $R_L$ 12.

In order to show the effectiveness of the driving operation with the DC pulse voltage, first of all, an example of the driving operation by the application of a DC constant voltage will be described.

Figure 9:
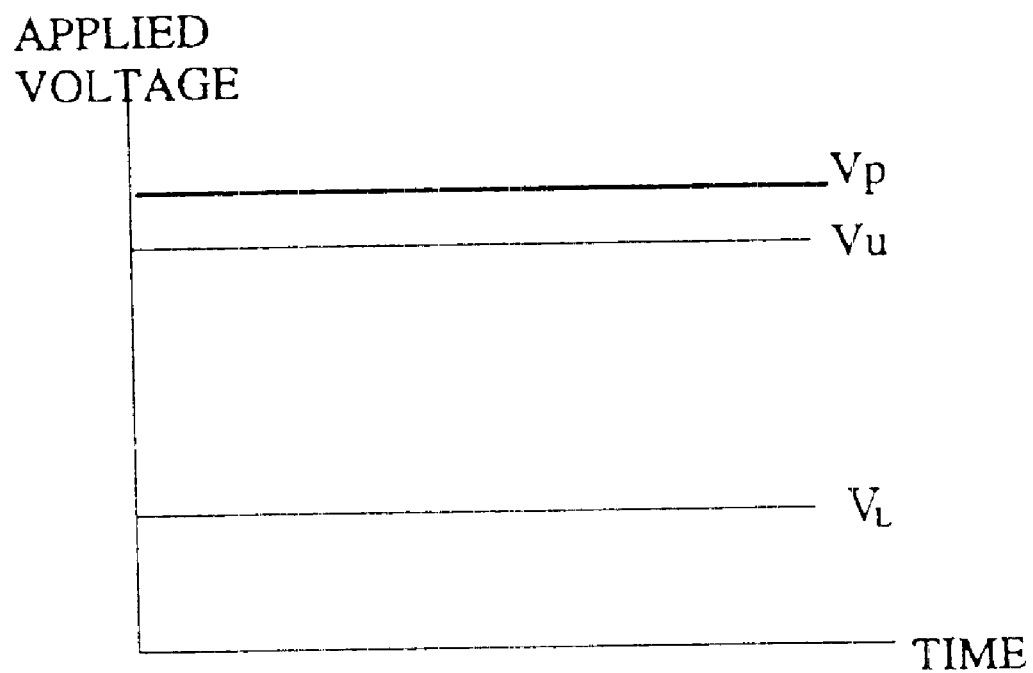
FIG. 9 is a chart showing a voltage Vp to be applied to the photodetector according to the present invention.

In FIG. 9, an axis of abscissa indicates a time required for voltage application and an axis of ordinate indicates a voltage value to be applied to the photodetector. Voltage values $V_L$ and $V_U$ are the same as described in FIG. 7(a). As the DC constant voltage is applied a DC constant voltage Vp ($>V_U>V_L$) greater than a voltage value with which a complete insulator-metal transition is caused by receiving light having an amount Pmax and an output is saturated.

Figure 10:
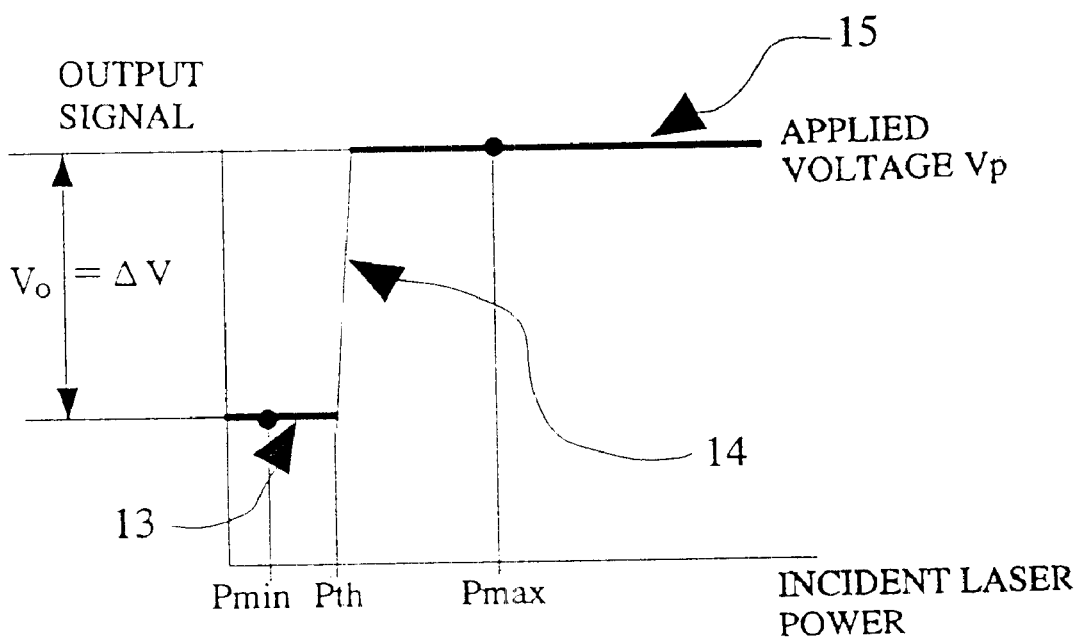
FIG. 10 is a chart showing the relationship between an amount of incident light and an output signal in the photodetector which is obtained when the voltage Vp is applied.

Next, the relationship between the amount of incident light and the output signal obtained through the load resistor $R_L$ 12 will be described with reference to FIG. 10. FIG. 10 is a graph obtained by applying a voltage $V_P$, wherein an axis of abscissa indicates the amount of incident light and an axis of ordinate indicates the output signal.

In the same manner as in FIG. 6, a non-amplification region 13 in which a transition is not caused by light irradiation and a change in the output is not obtained is shown in a thick line of the graph. When the amount of incident light is equal to or larger than a value (threshold Pth) with which the insulator-metal transition is started, an amplification region 14 in which a change in a resistance is caused depending on a variation in the amount of incident light is shown in a solid line of the graph, and a saturation region 15 in which the transition is completed is shown in a thick line of the graph.

The relationship between the amount of incident light and the output shown in FIG. 6 is different from the graph shown in FIG. 10 in that a change in which the amount of light exceeds Pth to be saturated is rapidly caused because the voltage value of Vp is greater than Vb and Va in FIG. 10, that is, the threshold Pth is present. Outputs at the amounts of light Pmin and Pmax are indicated by a black circle and a change $\Delta V$ in the output which is obtained for a variation in the amount of light Pmax–Pmin is represented as Vo.

Figure 11A:
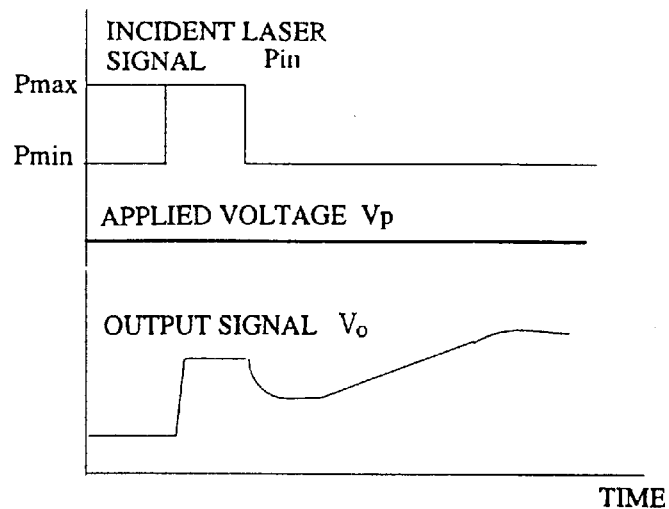
FIG. 11(a) is a chart showing a time variation in an output signal in the conventional element structure.
Figure 11B:
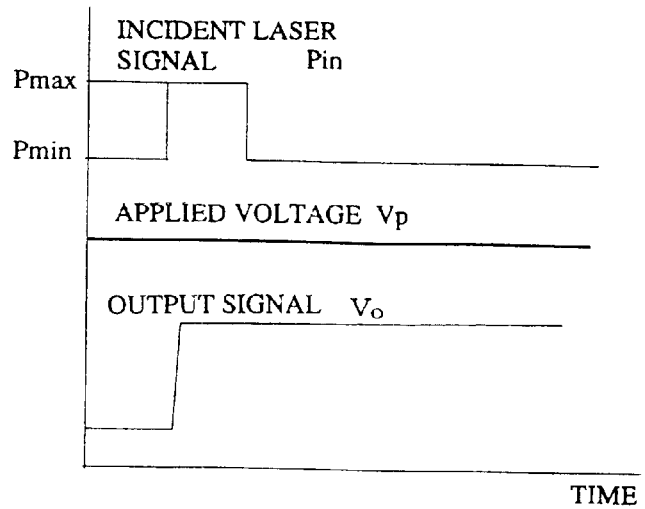
FIG. 11(b) is a chart showing a time variation in an output signal in the element structure according to the present invention.

Next, description will be given to an output signal waveform obtained by receiving an optical pulse. FIG. 11(a) shows a time variation in the output signal obtained by a conventional element structure and FIG. 11(b) shows a time variation in the output signal according to the embodiment of the present invention (any of the first to third embodiments), in which an axis of abscissa indicates a time and an axis of ordinate indicates a variation in an amount Pin of incident light (a graph in an upper portion), a DC constant voltage Vp to be applied (a graph in a middle portion) and an output signal Vo (a graph in a lower portion). When an optical pulse having a variation in the amount of light of Pmin to Pmax is received, the output signal Vo is obtained. As described in the element structure, in the conventional element, the relaxation time is long and a change in the signal cannot follow a variation in the amount of light. On the other hand, in the photodetector having the element structure according to the present invention, it is apparent that the change in the signal can follow the variation in the amount of light sufficiently quickly. In other words, it is clear that the element structure according to the present invention is effective.

As shown in FIG. 11(b), the transition has been completed as described above because the output value Vo is kept after the incident light signal is changed to Pmin. Any drawback in the photodetector which is thus caused will be described with reference to FIG. 12(a).

Figure 12A:
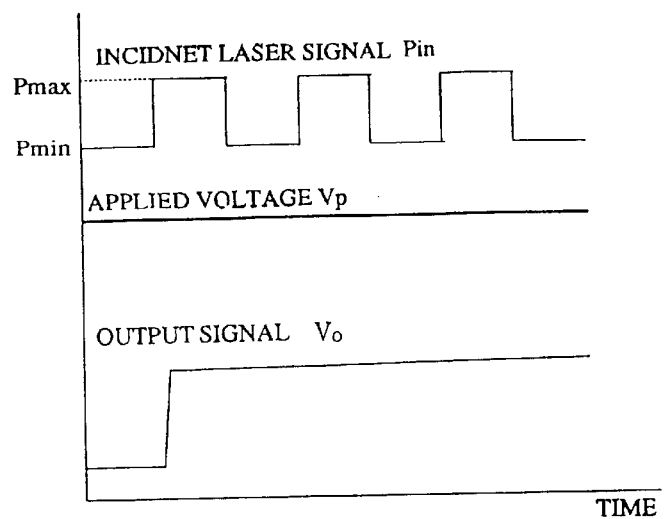
FIG. 12(a) is a chart showing a time variation in an output signal for a continuous optical pulse by a constant voltage driving operation.

FIG. 12(a) shows the state of an output signal obtained by continuously receiving an optical pulse having a variation in the amount of light of Pmin to Pmax, wherein an axis of ordinate indicates a variation in an amount Pin of incident light, a DC constant voltage Vo and an output signal Vo. As shown, it is apparent that a change in the output cannot be obtained for the optical pulse continuously incident because a transition has been completed by an initial optical pulse. More specifically, in the case in which a driving operation is carried out while performing a complete transition by the application of the DC constant voltage. it is clear that the variation in the continuous amount of light cannot be obtained and the present invention cannot be utilized as the photodetector.

Base on this respect, next, an example of the driving operation with a DC pulse voltage will be described.

Figure 12B:
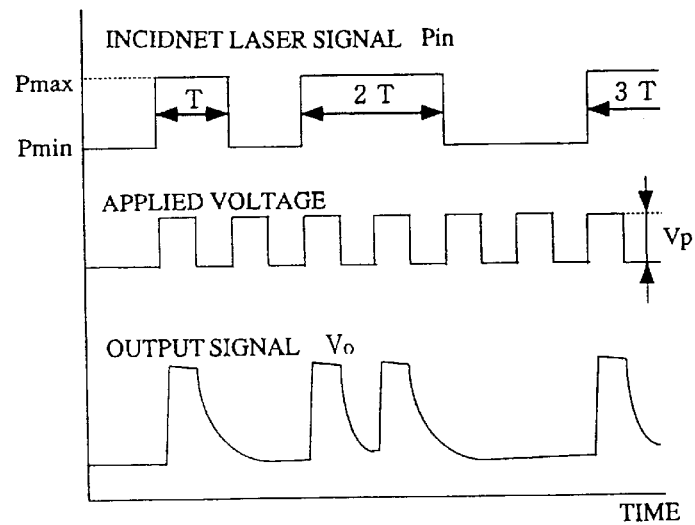
FIG. 12(b) is a chart showing a time variation in an output signal for optical pulses having different cycles which is obtained by a DC pulse voltage driving operation synchronous with the minimum cycle of the optical pulse.

FIG. 12(b) shows the state of an output signal Vo is obtained by receiving a series of optical pulses in which a variation in an amount of incident light is represented as Pmin to Pmax and a pulse width is changed in order of T (corresponding to a bit interval), 2T and 3T, wherein an axis of ordinate indicates a variation in an amount Pin of incident light, a DC pulse voltage (pulse height) Vp and the output signal Vo. If the cycle of a DC pulse voltage Vp to be applied is shorter than T/2, a continuous optical pulse can be received to meet the Nyquist theorem in principle. There is shown a change in the output obtained by synchronizing the incident light signal Pin with the DC pulse voltage Vp and setting the DC pulse voltage Vp to T/2. It is apparent that an output signal corresponding to an optical pulse width can be obtained.

Figure 12C:
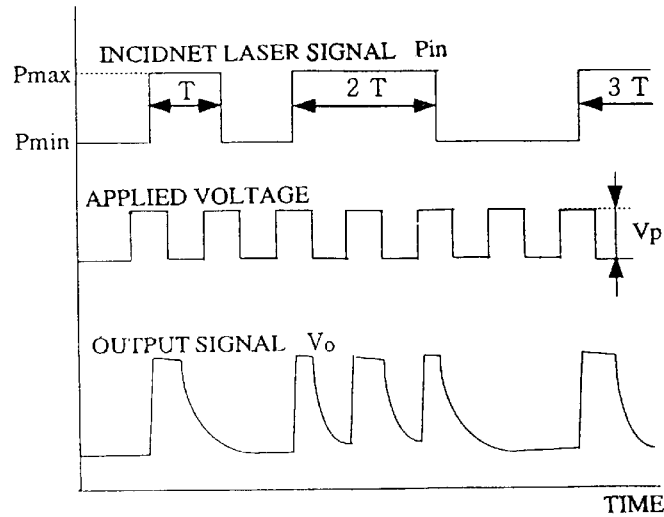
FIG. 12(c) is a chart showing a time variation in an output signal for optical pulses having different cycles by a DC pulse voltage driving operation shifted from the minimum cycle of the optical pulse by T/4.

With reference to FIG. 12(c), description will be given to the case in which the cycles of the incident light signal and the DC pulse voltage are shifted from each other by T/4. Similarly, FIG. 12C shows the state of the output signal Vo obtained by receiving a series of optical pulses in which a variation in an amount of light is represented as Pmin to Pmax and a pulse width is changed in order of T (corresponding to a bit interval), 2T and 3T, wherein an axis of ordinate indicates a variation in an amount Pin of incident light, a DC pulse voltage (pulse height) Vp and the output signal Vo. Referring to the state of the output signal Vo for the light signal Pin having a width of 2T, two output pulses are obtained in FIG. 12(b), while three output pulses are obtained in FIG. 12(c). Consequently, an error may be made for a temporal shift (jitter) of the incident light signal Pin.

This problem can be solved by the driving method for selecting well a voltage pulse width according to the present embodiment which will be described below.

Figure 13A:
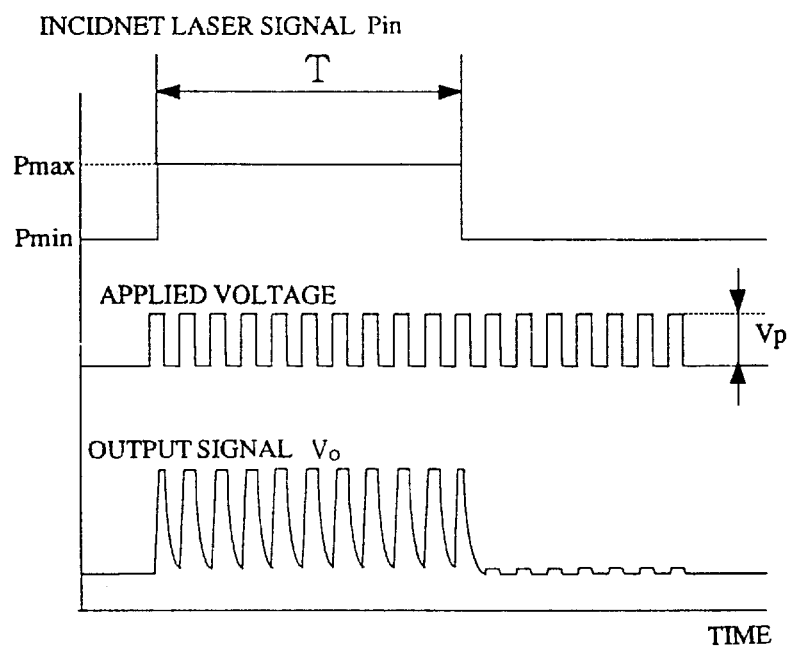
FIG. 13(a) is a chart showing a time variation in an output signal for an optical pulse which is obtained by a DC pulse voltage driving operation having a T/10 cycle for the minimum cycle of the optical pulse.

FIG. 13(a) is a time chart showing the relationship between an incident light signal and an output signal which is obtained when a photodetector is driven by the driving method according to the present embodiment. The time chart shows the state of an output signal Vo obtained by dividing a pulse width of a DC pulse voltage Vp into ten portions with respect to a minimum pulse width T of the light, which is enlarged in a direction of a time base. In the same manner as described above, an axis of ordinate indicates a variation in an amount Pin of incident light, a DC pulse voltage (pulse height) Vp and an output signal Vo. The cycle of the DC pulse voltage Vp is not synchronized with that of the light signal Pin.

Figure 13B:
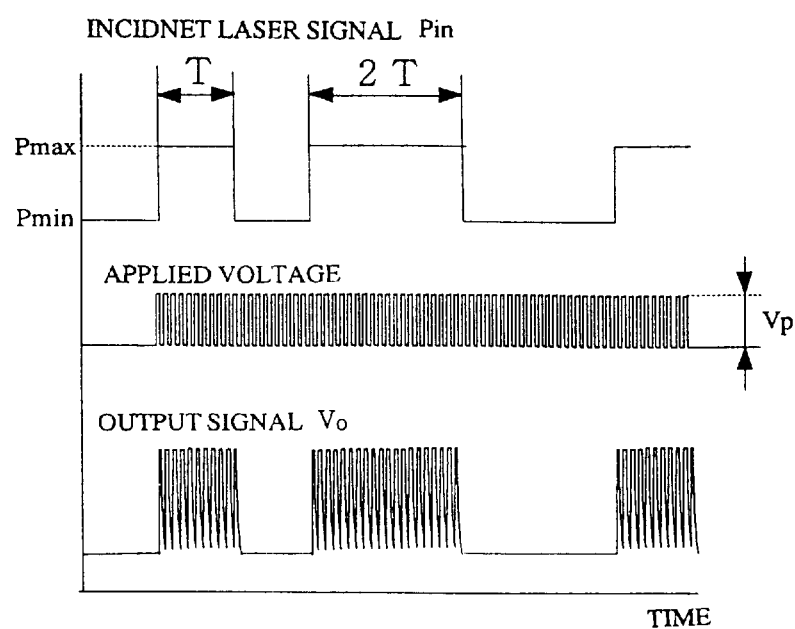
FIG. 13(b) is a chart showing a time variation in an output signal for optical pulses having different cycles which is obtained by a DC pulse voltage driving operation having the T/10 cycle for the minimum cycle of the optical pulse.

FIG. 13(b) is a time chart showing the state of an output signal obtained by selecting the pulse width of the DC pulse voltage Vp to 1/10 of the pulse width of the incident light signal Pin and receiving a series of optical pulses in which the pulse width is changed in order of T, 2T and 3T. As compared with the output signal Vo shown in FIG. 12(c), a group of output signals Vo are obtained corresponding to T, 2T and 3T, and a series of light signals Pin can be detected correctly. When the voltage pulse width of the DC pulse voltage Vp is more reduced, a temporal shift (a jitter component) of the output signal for the light signal is decreased. If the pulse width is set to T/10 or less, the influence on the jitter is reduced to 10% or less. Therefore, the photodetector for an optical memory does not particularly make troubles.

By the driving method according to the present invention described above, it is possible to obtain a photodetector having an amplifying function and capable of carrying out a high-speed and low-voltage operation. Moreover, a complete transition increases an operating speed, and furthermore, the operation is carried out with a threshold for the amount of light having a threshold. Consequently, it is possible to obtain a digital change in the output.

Sixth Embodiment

Furthermore, description will be given to a driving method for selecting a voltage pulse value as a second method utilizing a complete insulator-metal transition according to a sixth embodiment.

While the description has been given to, in the fifth embodiment, the method for selecting a voltage pulse width because an output is also dropped during a time required for receiving light by setting a voltage pulse value of Vp to an optical pulse, description will be given to a driving method capable of switching an output of a saturation region and that of an amplification region during the time required for receiving light, thereby detecting a series of optical pulses having a pulse width changed in order of T, 2T and 3T if the pulse width of an applied voltage is T/2 or less.

Figure 14A:
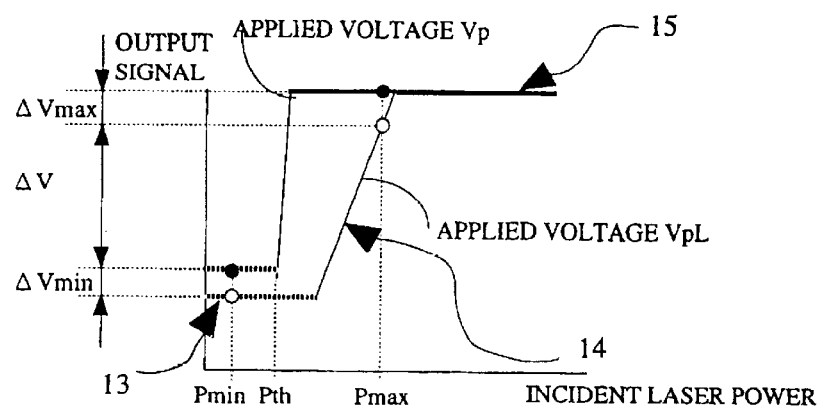
FIG. 14(a) is a chart showing the relationship between an amount of incident light and an output signal in the photodetector which is obtained when voltages $V_{PH}$ and $V_{PL}$ are applied.

FIG. 14(a) is a graph showing the relationship between an amount of incident light and an output signal obtained through a load resistor $R_L$ 12, wherein an axis of abscissa indicates the amount of incident light, and an axis of ordinate indicates the output signal, voltages of $V_{PH}$ and $V_{PL}$ being applied.

As described above, the applied voltage $V_{PH}$ has a greater value than a voltage value with which a complete insulator-metal transition is caused by receiving an amount Pmax of light and an output is saturated, and the applied voltage $V_{PL}$ has a small value than a minimum applied voltage value which can maintain (a resistance value of) the transition state. More specifically, in the case in which the voltage $V_{PH}$ is applied when the amount Pmax of light is received, the transition is completed and an output of a saturation region 15 is obtained. In the case in which the voltage $V_{PL}$ is applied, the transition is not maintained but switching is performed into an amplification region 14 in which an output corresponding to the amount of light is obtained.

First of all, description will be given to a change in the output obtained by receiving light while driving a DC pulse voltage Vp with a pulse height defined as $V_{PL}$ to $V_{PH}$. When the applied voltage Vp is changed from $V_{PH}$ to $V_{PL}$ for an amount Pmax of light, an output value Vo is reduced from a saturation value. This value is represented as ΔVmax.

Next, when the applied voltage Vp is similarly changed for an amount Pmin of light, a fluctuation in the output value Vo is measured for a fluctuation in a dark current. This is represented as ΔVmin. Accordingly, a change in the output obtained for a variation in the amount of light of Pmax–Pmin is represented as ΔV, the output signal Vo is obtained by adding +ΔVmax and +ΔVmin as a fluctuation in the output value to ΔV. The fluctuation is sufficiently small. As described above, moreover, the DC pulse driving operation features that a digital output is obtained. Therefore, it is possible to obtain an output capable of fully deciding "0" or "1".

Figure 14B:
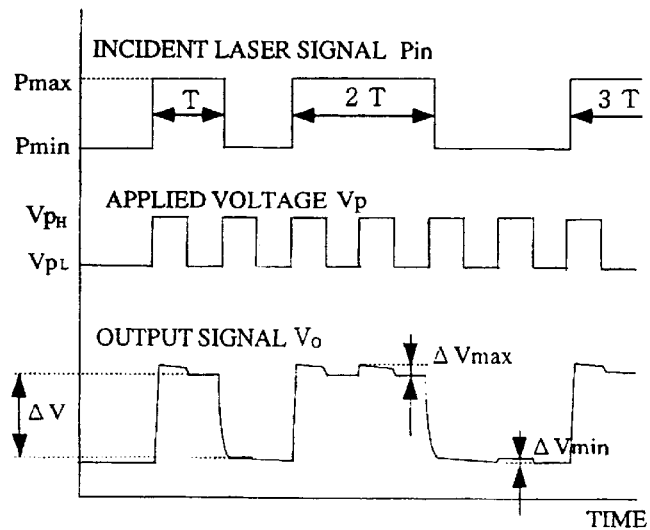
FIG. 14(b) is a chart showing a time variation in an output signal for optical pulses having different cycles which is obtained by a DC pulse voltage driving operation having pulse heights defined by the voltages $V_{PH}$ and $V_{PL}$ and synchronous with the minimum cycle of the optical pulse having a pulse height defined by the voltage $V_{PH}$ and $V_{PL}$.
Figure 14C:
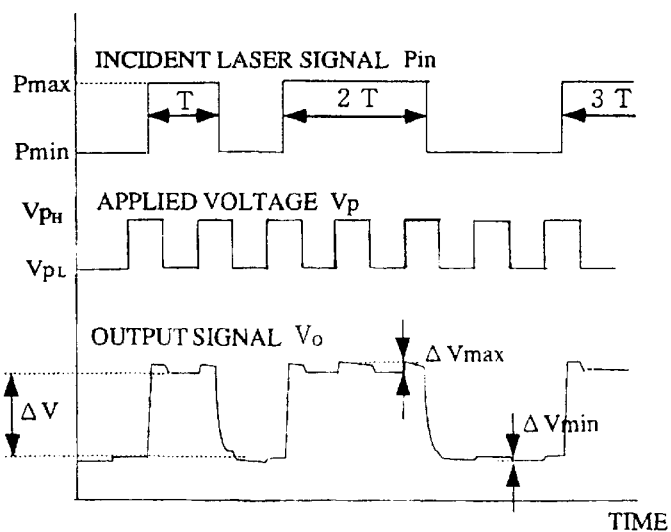
FIG. 14(c) is a chart showing a time variation in an output signal in an optical pulse shifted by a T/4 cycle from the minimum cycle of the optical pulse by a DC pulse voltage driving operation having pulse heights defined by the voltages $V_{PH}$ and $V_{PL}$ and synchronous with the minimum cycle of the optical pulse.

FIGS. 14(b) and 14(c) are time charts showing the relationship between an incident light signal and an output signal which is obtained when a photodetector is driven by the driving method according to the present embodiment. The time charts show the state of an output signal Vo obtained by receiving a series of optical pulses in which a variation in the amount of light is varied from Pmin to Pmax and a pulse width is changed in order of T, 2T and 3T (corresponding to a bit interval), wherein an axis of ordinate indicates a change in an amount Pin of incident light, a DC pulse voltage Vp and the output signal Vo. The DC pulse voltage Vp is defined between $V_{PH}$ and $V_{PL}$. FIG. 14(b) shows a change in the output obtained by synchronizing the light incident light signal Pin with the DC pulse voltage Vp and setting the DC pulse voltage Vp to T/2, and FIG. 14(c) shows the case in which a cycle of the incident light signal Pin is shifted from that of the DC pulse voltage Vp by T/4 (the driving operation with a pulse height Vp has the same condition as in the case in which detection cannot be carried out well).

The photodetector is driven with the DC pulse voltage Vp which is changed from $V_{PH}$ to $V_{PL}$. Therefore, even if a complete transition is carried out when the amount of light Pmax is received, a reversible state is brought when the voltage value is changed to $V_{PL}$ and an output value is not greatly lowered with the voltage value $V_{PL}$. Consequently, it is apparent that the output signal Vo is slightly varied depending on the cycle of the applied voltage Vp but a series of light signals can be clearly detected.

As shown in FIG. 14(c), moreover, it is apparent that a series of light signals can be clearly detected also in the case in which the cycle of the incident light signal Pin and that of the DC pulse voltage Vp are shifted from each other.

By the driving method according to the present invention described above, it is possible to obtain a photodetector having an amplifying function and capable of carrying out a high-speed and low-voltage operation. Moreover, a complete transition can increase an operating speed. In addition, if the cycle of the DC pulse voltage to be applied is T/2 or less for a cycle T of the incident light signal, a digital change in the output can be obtained without the influence on a jitter by the pulse cycle. Furthermore, it is not necessary to greatly increase the pulse frequency of the DC pulse voltage to be applied more than the minimum cycle of the light signal. Moreover, a small pulse height is permitted. Consequently, it is also possible to reduce power consumed by the driving operation.

Seventh Embodiment

Next, description will be given, as a seventh embodiment, to an example in which a signal is detected from an optical disk by an optical pickup using the photodetector (a thin film structure in the third embodiment).

First of all, the fabrication of the photodetector will be described. In the present embodiment, a lower electrode is formed on a $SrTiO_3$ substrate by sputtering. Subsequently, a $Pr_{0.7}Ca_{0.3}MnO_3$ thin film is formed as a photoelectric conversion layer by a sol-gel method. A forming method is as follows. A $Pr_{0.7}Ca_{0.3}MnO_3$ solution is applied by spin coating, and drying and prebaking (removal of an organic component) are then repeated until the film has a thickness of approximately 200 nm. Then, crystallization annealing is carried out at a temperature of 900° C. Thereafter, an ITO is formed as a transparent upper electrode by the sputtering. Furthermore, after the photodetector is divided into four portions, a protective film and an antireflection film are formed.

Figure 15:
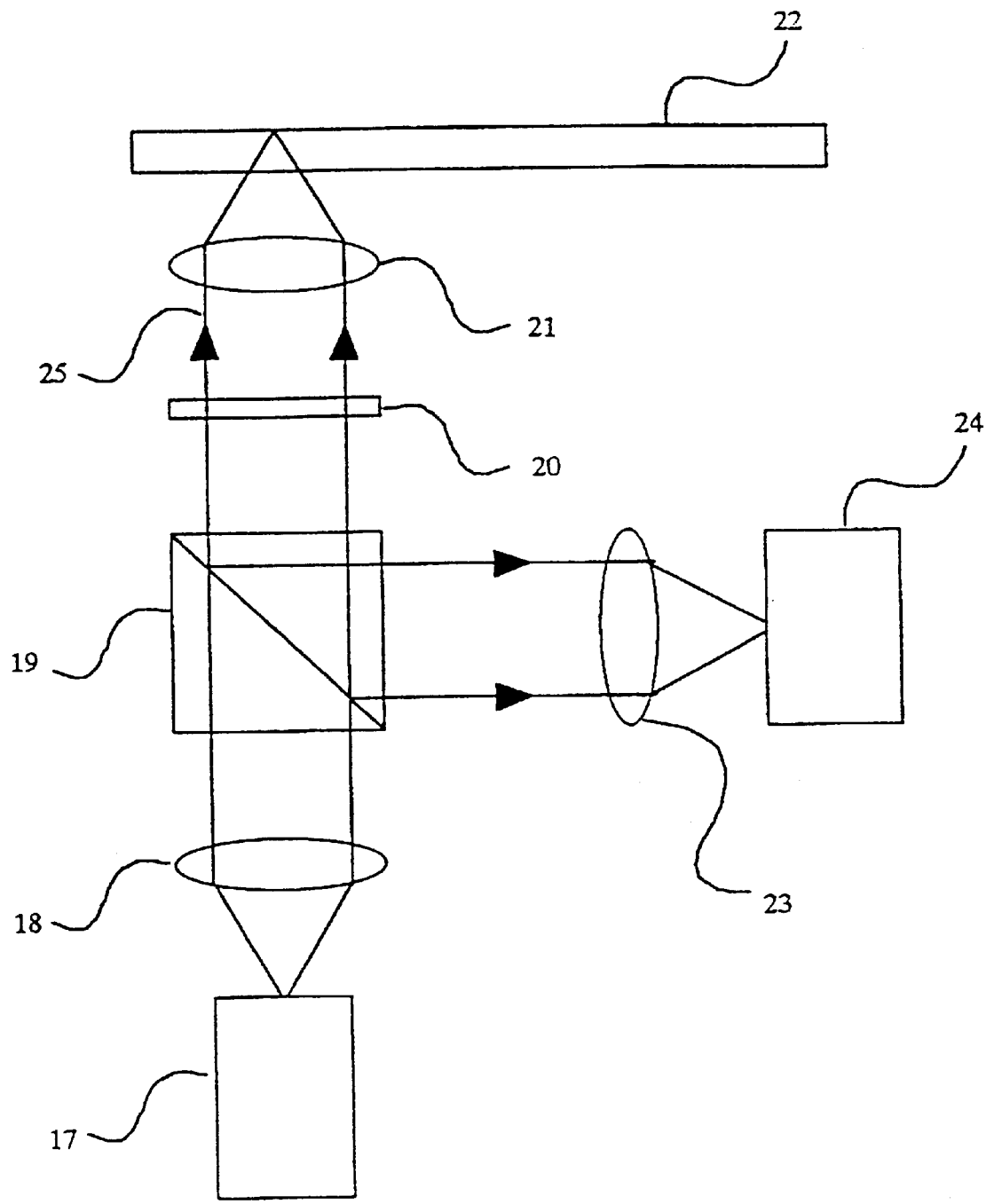
FIG. 15 is a diagram showing the schematic structure of an optical pickup using the photodetector according to the present invention.

The structure of the optical pickup using the photodetector according to the present invention will be described below with reference to FIG. 15. FIG. 15 is a diagram showing the schematic structure of the optical pickup for detecting a signal from an optical disk 22. Light 25 emitted from a semiconductor laser 17 is reshaped into a parallel beam through a collimate lens 18, and the parallel beam thus obtained passes through a beam splitter 19 and a λ/4 plate 20, and is then collected by an objective lens 21 and is guided onto the optical disk 22. A route for the light 25 reflected by the optical disk 22 is curved by 90 degrees by means of the beam splitter 19 and is guided to a four-division photodetector 24 through a detection lens 23.

The recording bit of the optical disk 22 has been detected by using a violet semiconductor laser as the semiconductor laser 17. A C/N (Carrier-to-Noise-ratio) obtained by a PIN photodiode of Si used in the conventional optical pickup has been 40 dB. On the other hand, in the optical pickup according to the present embodiment, a C/N of 60 dB has been obtained for a data rate of 5 MHz by the driving operation with a DC pulse voltage of 3 V to 5 V. Thus, the photodetector according to the present invention has an amplifying function, and therefore, can detect a feeble light signal from a very small bit also in the case in which a violet laser beam is used.

As described above, by using the photodetector, the driving method and the optical pickup according to the present invention thereof, feeble reflected light (several $\mu$W) can be detected from a recording bit by means of a violet light source. Consequently, it is possible to realize an optical pickup capable of decreasing a signal amount with an increase in the density of an optical memory and of carrying out a high-speed and low-voltage operation corresponding to a reduction in a wavelength of a light source. Consequently, a high density optical memory can be implemented.

Moreover, the photodetector according to the present invention has an operating principle which is different from the operating principle of a photodiode or the like. Therefore, the photodetector has a small wavelength dependency and displays a high light receiving sensitivity of a semiconductor laser having a wavelength of 780 nm, 650 nm, 635 nm or the like. Accordingly, the present invention can be applied to a light source having multiple wavelengths.

According to the above-mentioned embodiments, the photoelectric conversion can be carried out without a photoelectric conversion layer region in which a transition is not caused between electrodes. Consequently, it is possible to implement a photodetector having an amplifying function and capable of decreasing a signal amount with an increase in a density of an optical memory and of performing a high-speed and low-voltage operation corresponding to a reduction in a wavelength of a light source.

If a pair of electrodes have transparency in the above-mentioned structure, a photodetector having an amplifying function and capable of carrying out a high-speed and low-voltage operation can be implemented more easily without processing a photoelectric conversion layer.

Moreover, if the photoelectric conversion layer is interposed between a pair of electrodes like a sandwich and one of the electrodes has a transparency, it is possible to implement a photodetector having an amplifying function and capable of carrying out a high-speed and low-voltage operation in which a distance between the electrodes can easily be designed by the thickness of the photoelectric conversion layer.

If the photodetector is driven to be operated in such a state that the photoelectric conversion layer performs a transition from an insulator to a metal in analog depending on an amount of received light, it is possible to implement a photodetector having an amplifying function and capable of carrying out a high-speed and low-voltage operation in which a change in an output corresponding to the amount of received light can be obtained.

In the driving method, if the threshold of a minimum amount of light which can be detected is controlled by a constant DC voltage value to be applied between a pair of electrodes, it is possible to maximize a change in an output value for a variation in the amount of light by controlling the detected threshold of the amount of light.

Moreover, if the photodetector is driven to be operated in such a state that the photoelectric conversion layer performs a transition from an insulator to a metal in digital depending on an amount of received light by applying a DC pulse voltage between a pair of electrodes, an operating speed can be increased and a digital change in an output can be obtained for a variation in the amount of light.

In the driving method, by setting the pulse width of the DC pulse voltage to be applied between a pair or electrodes to 1/10 or less of the minimum pulse width of the light to be received, it is possible to reduce the influence on a jitter to 10% or less without synchronizing a light signal with the DC pulse voltage and to obtain a digital change in an output for the conversion of the amount of light.

In the driving method, the minimum value of the DC pulse voltage to be applied between a pair of electrodes is set greater than a voltage value with which the photoelectric conversion layer starts an insulator-metal transition and is set smaller than a minimum voltage value capable of maintaining a resistance value obtained when the photoelectric conversion layer completes the insulator-metal transition. Consequently, it is possible to obtain a digital change in an output for a variation in the amount of light without the influence on a jitter by the cycle of the DC pulse voltage.

By using the photodetector and the driving method thereof, it is possible to implement an optical pickup corresponding to a decrease in a signal amount with an increase in the density of an optical memory and a reduction in a wavelength of a light source (violet color: wavelenlgth $\lambda$=approximately 400 nms). Thus, a high density optical memory can be obtained.

Numerous modifications and alternative embodiments of the invention will be apparent to those skilled in the art in view of the foregoing description. Accordingly, this description is to be construed as illustrative only, and is provided for the purpose of teaching those skilled in the art the best mode of carrying out the invention. The details of the structure and/or function may be varied substantially without departing from the spirit of the invention and all modifications which come within the scope of the appended claims are reserved.

What is claimed is:

1. A photodetector comprising:
    a photoelectric conversion layer for performing an insulator-metal transition by receiving light; and
    a pair of electrodes provided opposite to each other in contact with said photoelectric conversion layer, between which a voltage is applied,
    wherein said pair of electrodes are arranged on said photoelectric conversion layer such that a region of said photoelectric conversion layer which performs said insulator-metal transition and a region to which said voltage is applied through said pair of electrodes are substantially coincident with each other.

2. A photodetector according to claim 1, wherein said electrodes are placed in a pair of concave portions provided on said photoelectric conversion layer.

3. A photdetector according to claim 1, wherein said electrodes permit passage of light.

4. A photodetector according to claim 1, wherein said photoelectric conversion layer is interposed between said electrodes and one of said electrodes has transparency.

5. A method of driving a photodetector comprising applying a constant DC voltage between said pair of electrodes of said photodetector as set forth in claim 1, thereby causing said photodetector to be operated in such a state that said photoelectric conversion layer of said photodetector performs said transition from an insulator to a metal in an analog manner according to the amount of received light.

6. A method of driving a photodetector according to claim 5, wherein a threshold for a minimum amount of light which can be detected is controlled by a value of said DC voltage to be applied between said electrodes.

7. A method of driving a photodetector comprising applying a DC pulse voltage between said pair of electrodes of said photodetector as set forth in claim 1, thereby causing said photodetector to be operated in such a state that said photoelectric conversion layer of said photodetector performs said transition from an insulator to a metal in a digital manner according to the amount of received light.

8. A method of driving a photodetector according to claim 7, wherein a pulse width of said DC voltage to be applied between said electrodes is 1/10 or less of a minimum pulse width of said received light.

9. A method of driving a photodetector according to claim 7, wherein a minimum value of said DC pulse voltage to be applied between said electrodes is set greater than a voltage value with which said photoelectric conversion layer starts said insulator-metal transition and is set smaller than a minimum voltage value capable of maintaining a resistance value obtained when said photoelectric conversion layer completes said insulator-metal transition.

10. An optical pickup incorporating a photodetector as set forth in claim 1 for reading a light signal from an optical memory by driving said photodector by a driving method as set forth in claim 5 or 7.

* * * * *